US 9,910,364 B2

(12) United States Patent
Bittner et al.

(10) Patent No.: US 9,910,364 B2
(45) Date of Patent: Mar. 6, 2018

(54) PROJECTION EXPOSURE APPARATUS INCLUDING AT LEAST ONE MIRROR

(71) Applicant: Carl Zeiss SMT GmbH, Oberkochen (DE)

(72) Inventors: Boris Bittner, Roth (DE); Norbert Wabra, Werneck (DE); Sonja Schneider, Oberkochen (DE); Ricarda Schoemer, Zusmarshausen (DE); Stefan Rist, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/298,323

(22) Filed: Oct. 20, 2016

(65) Prior Publication Data
US 2017/0115576 A1   Apr. 27, 2017

(30) Foreign Application Priority Data
Oct. 21, 2015 (DE) .................. 10 2015 220 537

(51) Int. Cl.
*G03F 7/20* (2006.01)
(52) U.S. Cl.
CPC ........ *G03F 7/70191* (2013.01); *G03F 7/7015* (2013.01)
(58) Field of Classification Search
CPC ............... G03F 7/70191; G03F 7/7015; G03F 7/70058; G03F 7/70258
USPC .................. 355/52, 53, 55, 67–71
See application file for complete search history.

(56) References Cited

U.S. PATENT DOCUMENTS

| 2011/0080569 A1 | 4/2011 | Eva et al. |
| 2013/0188246 A1 | 7/2013 | Rogalsky et al. |
| 2013/0258302 A1* | 10/2013 | Bittner ................ G03F 7/70258 355/67 |

(Continued)

FOREIGN PATENT DOCUMENTS

| DE | 10 2012 205 096 B3 | 8/2013 |
| WO | WO 2008/034636 A2 | 3/2008 |

(Continued)

OTHER PUBLICATIONS

Malacara, "Optical Shop Testing"—Chapter 13.2.3, $2^{nd}$ Edition (1992) John Wiley & Sons, Inc.

(Continued)

*Primary Examiner* — Hung Henry Nguyen
(74) *Attorney, Agent, or Firm* — Fish & Richardson P.C.

(57) ABSTRACT

A microlithographic projection exposure apparatus includes: a projection lens for imaging mask structures via an exposure radiation including at least one optical element and at least one manipulator; a read-in device for reading in application-specific structure information defining at least one property of an angular distribution of the exposure radiation upon entering the projection lens; and a travel establishing device for establishing a travel command defining a change to be made in an optical effect of the at least one optical element by manipulation of a property of the optical element via the at least one manipulator along a travel. The travel establishing device is configured to establish the travel command in an at least two-stage optimization.

15 Claims, 3 Drawing Sheets

(56) References Cited

U.S. PATENT DOCUMENTS

2014/0176924 A1 6/2014 Bittner et al.
2016/0033873 A1 2/2016 Bittner et al.

FOREIGN PATENT DOCUMENTS

WO WO 2010/034674 A1 4/2010
WO WO 2015/036002 A1 3/2015

OTHER PUBLICATIONS

H. Gross, "Handbook of Optical Systems"—Table 20-2, vol. 2 (2005) Wiley-VCH Verlag GmbH & Co. KGaA, Weinheim (p. 215).

* cited by examiner

PROJECTION EXPOSURE APPARATUS INCLUDING AT LEAST ONE MIRROR

CROSS-REFERENCE TO RELATED APPLICATIONS

This application claims benefit under 35 U.S.C. § 119 to the German Patent Application No. 10 2015 220 537.1 filed on Oct. 21, 2015. The entire disclosure of this patent application is incorporated into the present application by reference.

FIELD

The disclosure relates to a microlithographic projection exposure apparatus and to a method for controlling such a projection exposure apparatus. A microlithographic projection exposure apparatus, in the production of semiconductor components, serves for producing structures on a substrate in the shape of a semiconductor wafer. For this purpose, the projection exposure apparatus includes a projection lens for imaging mask structures onto the wafer during an exposure process, the projection lens having at least one optical element, in particular a plurality of optical elements.

BACKGROUND

A projection lens having the smallest possible wavefront aberrations is often desirable to ensure that the mask structures are imaged onto the wafer as precisely as possible. Projection lenses are therefore equipped with manipulators which make it possible to correct wavefront aberrations via a change in state of individual optical elements of the projection lens. Examples of such a change in state include: a change of position in one or more of the six rigid-body degrees of freedom of the relevant optical element, application of heat and/or cold to the optical element, and a deformation of the optical element.

To correct aberrations of the projection lens occurring over the course of time, the travels of the manipulators are regularly readjusted. For this purpose, a travel establishing device establishes a travel command which contains travel settings for the individual manipulators of the projection lens. The readjustment of the manipulator travels is generally effected in different adjustment stages. A first of the adjustment stages includes a maintenance adjustment performed at relatively long intervals, such as of approximately a few weeks or approximately one month. Another of the adjustment stages includes an operating adjustment performed during exposure operation of the projection exposure apparatus with a high cycle rate of at least one repetition per second, in particular of at least 1000 repetitions per second.

During the operating adjustment, the aberration characteristic of the projection lens is usually measured regularly and, if appropriate, changes in the aberration characteristic between the individual measurements are determined by simulation. In this regard, for example, lens element heating effects can be taken into account computationally. In this context, a "lens element heating" is understood to mean not only the heating of a transmission lens element but also the heating of a mirror. The manipulator changes to be performed for correcting the aberration characteristic are calculated via a travel generating optimization algorithm, which is also designated as "manipulator change model" or "lens element model". Such optimization algorithms are described for example in WO 2010/034674 A1.

The angular distribution of the exposure radiation that is present upon entering the projection lens is influenced by the so-called illumination mode used during the exposure process and also the structure type of the mask structures imaged in this case. Illumination mode and structure type of the imaged mask structures are application-specific and are often designated as "UseCase". Information regarding illumination mode and/or structure type is designated below as application-specific structure information.

Taking account of the application-specific structure information for calculating the travel command in the context of the operating adjustment conventionally involves the use of time-consuming "fundamental" optimization algorithms for establishing the travel command, which has the effect that the cycle rate achievable in this case is regarded as insufficient for the operating adjustment. Therefore, "fast" optimization algorithms, such as, for instance, optimization algorithms based on Tikhonov regularization, are often used. Such "fast" optimization algorithms, compared with the "fundamental" algorithms, at the expense of accuracy, are often simplified or based on simplified assumptions, such that they can proceed in a shorter time. In the case of the "fast" optimization algorithms used here, it is conventional practice to dispense with taking account of the application-specific structure information on account of the time losses associated therewith. In this regard, in the case of a Tikhonov-regularized optimization algorithm, for instance, taking account of the illumination mode involves subsequent optimization of weighting parameters explained in greater detail below, which in light of the prior art is not automatable, but rather involves a qualified engineer. Therefore, an adaptation of the optimization result to the illumination mode is usually dispensed with in the prior art.

In the case of the maintenance adjustment performed at relatively long intervals, a so-called standard setup is carried out, which is very complex and generally takes up several hours. All the manipulators of the projection lens are preferably used in this case. The manipulators generally include so-called semiactive manipulators alongside conventional manipulators, the driveability of which is not subject to any restrictions. Semiactive manipulators can implement only a very limited number of drivings over their lifetime. The semiactive manipulators include e.g. manipulators for decentrization of lens elements and/or mirrors orthogonally with respect to the optical axis of the projection lens. The degrees of freedom assigned to the semiactive manipulators are also designated as partly active manipulator degrees of freedom in the context of this application. The semiactive manipulators have only a limited influence on the possible performance of the lens and primarily serve for extending the range of the manipulator system of the projection lens over the lifetime of the lens.

On account of the high expenditure of time for carrying out a standard setup, it is conventional practice here to optimize the projection lens without taking account of the application-specific structure information defined by the "UseCase". Rather, the optimization aims to uniformly minimize the wavefront deviations. The blame for dispensing with taking account of the application-specific structure information in the conventional standard setup lies with practice in semiconductor production, according to which in exposure operation the "UseCase" set at the projection exposure apparatus is changed frequently, e.g. within one day and/or within one week. If the application-specific structure information were taken into account in the standard setup, the standard setup would have to be repeated upon each change of the "UseCase", which would result in each case in a production outage of at least several hours.

SUMMARY

The disclosure seeks to provide a projection exposure apparatus and a method for controlling such a projection exposure apparatus with which the problems mentioned above are solved and, in particular, a fast establishment of a travel command adapted to the application-specific structure information is made possible. This applies firstly to the establishment of a travel command in the context of an operating adjustment, that is to say during exposure operation, and secondly to the establishment of a travel command in the context of a maintenance adjustment.

The disclosure includes a microlithographic projection exposure apparatus including a projection lens for imaging mask structures via an exposure radiation. The projection lens has at least one optical element and at least one manipulator. Furthermore, the projection exposure apparatus includes a read-in device for reading in application-specific structure information which defines at least one property of an angular distribution of the exposure radiation upon entering the projection lens, and a travel establishing device for establishing a travel command which defines a change to be made in an optical effect of the at least one optical element by manipulation of a property of the optical element via the at least one manipulator along a travel. The travel establishing device is configured to establish the travel command in an at least two-stage optimization. In this case, a first stage of the optimization is configured to establish an approximation of the travel command from a state characterization of the projection lens via a first optimization algorithm, which is based on a predefined standard angular distribution of the exposure radiation upon entering the projection lens. A second stage of the optimization is configured to establish an optimization result of the travel command, via a second optimization algorithm, from the approximation of the travel command taking account of the application-specific structure information.

The angular distribution of the exposure radiation should be understood to mean an angle-resolved intensity distribution of the exposure radiation. The read-in device can be embodied as an input device for manually inputting the application-specific structure information or as a data transmission interface for automatically reading in the application-specific structure information.

The use of the designation "first stage of the optimization" and "second stage of the optimization" means that the second stage of the optimization temporarily succeeds the first stage of the optimization; however, this does not necessarily need to occur directly, that is to say that it is not excluded thereby to effect, if appropriate, a further (intermediate) stage of the optimization between the first stage and the second stage of the optimization.

The travel establishing device according to the disclosure can be configured for establishing the travel command in the context of an operating adjustment in accordance with one embodiment and for establishing the travel command in the context of a maintenance adjustment in accordance with a further embodiment.

In the embodiment of the travel establishing device configured for the operating adjustment, the two-stage optimization according to the disclosure makes it possible to establish a travel command adapted to the application-specific structure information with a cycle rate that is high enough for the purposes of the operating adjustment. On account of the use of a predefined standard angular distribution of the exposure radiation that is implemented according to the disclosure in the first stage of the optimization, a "fast" optimization algorithm, e.g. based on Tikhonov regularization, can be used for the first optimization algorithm used here. Since the assumed angular distribution of the exposure radiation thus does not vary in the first optimization stage, for instance a subsequent optimization of weighing parameters of the Tikhonov regularization is not necessary, for which reason the first optimization stage can proceed fully automatically at high speed.

Since the second stage of the optimization according to the disclosure can proceed from the approximation generated in the first stage, the optimization complexity for establishing the optimization result taking account of the application-specific structure information is comparatively low. Thus, the second optimization stage, e.g. via a "fundamental" optimization algorithm which would be too time-consuming in a conventional one-stage optimization, can establish the optimization result in a comparatively short time.

Furthermore, the two-stage optimization according to the disclosure enables the number of manipulator degrees of freedom on which the second optimization stage is based to be kept smaller than would be possible in the case of a one-stage optimization. In particular, the number of manipulator degrees of freedom on which the second optimization stage is based can be kept smaller than the manipulator degrees of freedom on which the first optimization stage is based. In this regard, for example, the second optimization stage can be based only on so-called overlay degrees of freedom, explained in greater detail below.

A reduced number of manipulator degrees of freedom on which the second optimization stage is based also makes it possible to use a "fast" optimization algorithm for the second optimization stage, such as, for instance, an optimization algorithm in a Tikhonov regularization, in which the weighting parameters are then chosen comparatively robustly, i.e. with comparatively high values which allow only small deflections of the assigned manipulator degrees of freedom.

A reduced number of manipulator degrees of freedom on which the second optimization stage is based furthermore makes it possible to dispense with the step of advance calculation of a pseudo-inverse of the so-called normal equation, which step is absolutely necessary in many major optimization problems, such as, for example, in the optimization of a merit function in a Tikhonov regularization using singular value decomposition (SVD). Dispensing with this step furthermore makes it possible to perform the second optimization stage at high speed.

In the embodiment of the travel establishing device configured for the maintenance adjustment, the two-stage optimization according to the disclosure makes it possible to take account of the application-specific structure information, defined for example by the "UseCase". In this regard, the splitting into a first optimization stage based on a standard angular distribution and a second optimization stage, which processes further the result of the first optimization stage taking account of the application-specific structure information, allows the second optimization stage to be performed separately for the case where the application-specific structure information, in particular the "UseCase", has changed.

The separate performance of the second optimization stage can also be designated as "application-specific fast setup". This "application-specific fast setup" can be carried out in a short period of time and thus affords the possibility of rapidly establishing a travel command adapted to the application-specific structure information. In accordance with one embodiment, the second optimization algorithm is configured in such a way that, in the embodiment configured for the maintenance adjustment, the second optimization stage can be carried out in a period of time which is less than 20%, in particular less than 10%, of the period of time for carrying out the first optimization stage. The period of time for carrying out the second optimization stage can be for example less than 1 hour, less than 10 minutes, less than 1 minute or less than 1 second.

As already mentioned above, in accordance with one embodiment, the first optimization algorithm is based on a merit function in a Tikhonov regularization which contains implicit constraints described with the aid of weighting parameters. Such a merit function in a Tikhonov regularization is described for example on page 42 of WO 2010/034674A1 under (a'''). In accordance with a further embodiment, the first optimization algorithm is configured to establish the solution of the optimization of the merit function, which can be configured in a Tikhonov regularization or else in some other form, on the basis of a singular value decomposition.

In accordance with a further embodiment, the first optimization algorithm and/or the second optimization algorithm are/is based on a merit function in a Tikhonov regularization which contains implicit constraints described with the aid of weighting parameters, wherein the values of the weighting parameters are left unchanged in each case when the first optimization algorithm and/or the second optimization algorithm are/is executed. A fine setting of the Tikhonov weighting parameters is therefore not effected during the respective optimization stage. As already mentioned above, such a merit function in a Tikhonov regularization is described for example on page 42 of WO 2010/034674A1 under (a'''). The weight matrix G contained therein contains the weighting parameters mentioned above. The weighting parameters serve to counteract a deviation of a travel setting of a relevant travel from a basic setting during the execution of the optimization algorithm. This counteracting is effected by virtue of the fact that in the case of an increasing deviation of the travel setting of a travel from the basic setting thereof, the value of a penalty term progressively increases.

In accordance with a further embodiment, the application-specific structure information includes an indication regarding the illumination mode used during the imaging of the mask structures and/or an indication regarding a structure type of the mask structures.

In accordance with a further embodiment, the travel command includes travel settings which are assigned to a multiplicity of manipulator degrees of freedom of the at least one manipulator. Those travel settings which are assigned to a first set of the manipulator degrees of freedom serve as optimization variables in the first stage of the optimization, and those travel settings which are assigned to a second set of the manipulator degrees of freedom, the second set not being identical to the first set of the manipulator degrees of freedom, serve as optimization variables in the second stage of the optimization.

In accordance with a further embodiment, the first set of the manipulator degrees of freedom and the second set of the manipulator degrees of freedom are disjoint. In accordance with a further embodiment, the second set contains fewer manipulator degrees of freedom than the first set.

In accordance with a further embodiment, the second set of manipulator degrees of freedom includes overlay degrees of freedom of the projection lens which are selected in such a way that a manipulation via the at least one manipulator along one of the overlay degrees of freedom or along a combination of a plurality of the overlay degrees of freedom brings about a change in an overlay aberration of the projection lens. Overlay aberrations indicate local image position displacements of imaged mask structures relative to the setpoint positions thereof on the substrate. The overlay aberration can include an image position displacement of an imaged mask structure at one or a plurality of field points. Overlay aberrations which can be changed by manipulation along one or a plurality of the overlay degrees of freedom can correlate with deviations in the Zernike coefficients Z2, Z3, Z7 and Z8. A combination of a plurality of overlay degrees of freedom is also designated as virtual manipulator, as described for example in WO 2015/036002 A1.

A manipulator having at least one overlay degree of freedom can be realized for example by a deformable plate arranged in a near-field position. In the case where mirrors are used as optical elements of the projection lens, such manipulators can also be realized by active mirror surfaces. In the case of the latter, local shape defects in the mirror surface can be actively corrected. In one embodiment of an optical element having an active mirror surface, the optical element has a carrying structure and an optical surface structure that is deformable with respect to the carrying structure. The top side of the optical surface structure serves as mirror surface and thus for reflecting the exposure radiation. The surface structure is supported by supporting elements at a multiplicity of points. An actuation location with an actuator for raising or lowering a corresponding section of the surface structure is in each case arranged between the supporting elements. The actuators can be pneumatic, electrostatic, magnetic or piezotechnology-based actuators.

Furthermore, a manipulator having overlay degrees of freedom can be realized by a thermal manipulator arranged in a pupil plane of the projection lens. Such a thermal manipulator is described for example in WO 2008/034636 A2. This involves a current-operated thermal manipulator having a plane-parallel quartz plate. The plate contains a two-dimensional matrix of heating zones which can be individually heated via conductor tracks and resistive structures. By setting the electrical power introduced, it is possible to set an individual temperature and thus a specific refractive index for each zone.

In accordance with a further embodiment, the state characterization of the projection lens includes field-resolved overlay aberration parameters characterizing the imaging quality of the projection lens with respect to overlay aberrations, and the overlay degrees of freedom are selected in such a way that one of the overlay degrees of freedom or a combination of the overlay degrees of freedom is suitable for correcting a field profile of at least one of the overlay aberration parameters. The field profile of the at least one of the aberration parameters should be understood to mean the profile of the aberration parameter when the aberration parameter is measured at different locations in the image field of the projection lens. The combination of a plurality of overlay degrees of freedom for correcting the field profile of at least one of the aberration parameters should be understood to mean an actuation of the at least one manipulator along a combination of the manipulator degrees of freedom identified as overlay degrees of freedom such that the field profile of the at least one overlay aberration parameter is corrected.

In accordance with one embodiment variant, the field profile of the at least one overlay aberration parameter which is provided for correction via the overlay degrees of freedom is one of the following field profiles: the field profile of third order of the Zernike coefficients Z2 (Z2_3) or of a higher order of the Zernike coefficient Z2, the field profile of fourth order of the Zernike coefficient Z3 (Z3_4) or of a higher order of the Zernike coefficient Z3. In this context, the order of the field profile is understood to mean the radial order of the field profile.

In accordance with a further embodiment, the state characterization of the projection lens includes aberration parameters characterizing the imaging quality of the projection lens, and the second stage of the optimization is effected on the basis of a subset of the aberration parameters whose elements in each case relate to an overlay aberration of the projection lens.

In accordance with a further embodiment, the travel establishing device is configured to establish the travel command in less than one second. In this case, the travel establishing device is configured for the operating adjustment. In particular, the travel establishing device is configured to establish the travel command in a period of time of less than 100 milliseconds, in particular of less than 50 milliseconds or less than 20 milliseconds. Such a fast establishment of the travel command can also be designated as real-time establishment. An updating rate of the state characterization is correspondingly adapted to the clock rate of the travel establishing device.

In accordance with a further embodiment, the travel establishing device is configured to carry out the two-stage optimization in the context of a maintenance adjustment and to perform the second stage of the optimization, in each case proceeding from the approximation of the travel command, for different items of application-specific structure information. In other words, the travel establishing device is configured to establish from the approximation of the travel command established by the first optimization stage, by multiple performance of the second optimization stage, different optimization results respectively adapted to a different item of application-specific structure information. The first performance of the second optimization stage can be effected in the context of a so-called "standard setup" on the basis of a forthcoming "UseCase". The second performance of the second optimization stage can then be effected in the context of a so-called "fast setup", in which the result of the first optimization stage performed in the context of the "standard setup" is then adapted to a new "UseCase".

In accordance with a further embodiment, each of the manipulator degrees of freedom is allocated an expected lifetime performance which specifies an expected maximum number of travel adjustments along the relevant manipulator degree of freedom that are able to be performed over the lifetime of the projection lens. The manipulator degrees of freedom include at least one partly active manipulator degree of freedom and at least one fully active manipulator degree of freedom, wherein the lifetime performance of the fully active manipulator degree of freedom is greater than the lifetime performance of the partly active manipulator degree of freedom by at least a factor of 100, and wherein the at least one partly active manipulator degree of freedom is included by the first set of the manipulator degrees of freedom and is not included by the second set of the manipulator degrees of freedom. In particular, the respective lifetime performance of the fully active manipulator degrees of freedom is greater than the respective lifetime performance of the partly active manipulator degrees of freedom by at least a factor of 100, in particular by at least a factor of 1000. The partly active manipulator degrees of freedom should be understood to mean, in particular, the degrees of freedom of movement that are able to be implemented via the semi-active manipulators mentioned above.

In accordance with a further embodiment, an algorithm generator is furthermore provided, which is configured to generate the second optimization algorithm on the basis of the application-specific structure information. In accordance with one embodiment variant, the second optimization algorithm generated by the algorithm generator includes a merit function and, in particular, at least one constraint described outside the merit function, also designated as external constraint. In this case, the number of external constraints can be greater than 100, greater than 1000, greater than 10 000 or greater than 100 000.

In accordance with a further embodiment, the second optimization algorithm is based on a merit function containing at least one implicit constraint. The implicit constraint can be a limit for an image aberration selected from a group of image aberrations, such as, for instance, odd Zernike coefficients, or a combination of specific image aberrations, such as e.g. a root mean square (RMS) of Zernike coefficients which belong in particular to a predetermined group of Zernike coefficients.

In accordance with a further embodiment, the at least one implicit constraint contains a limit for one lithographic image aberration or a combination of a plurality of lithographic image aberrations, wherein a lithographic image aberration is determinable on the basis of at least one image of the mask structures that is generated lithographically via the projection lens. "Lithographic aberrations" are understood to mean aberrations of the projection lens which are directly measurable in the lithographic image, i.e. in the areal image present in the substrate plane, or in the structure produced by the lithographic imaging in the photoresist on the substrate. Such lithographic aberrations are also designated as imaging size aberrations and are in contrast to wavefront aberrations, which cannot be measured directly in the lithographic image. One example of such a lithography aberration is a so-called "overlay aberration". As already mentioned above, overlay aberrations indicate local image position displacements of imaged mask structures relative to the setpoint position thereof on the substrate.

In accordance with a further embodiment, the lithographic image aberration includes an overlay aberration, a focal position aberration and/or a fading aberration. The fading aberration relates to a projection exposure apparatus embodied as a step-and-scan exposure apparatus. In this case, during the imaging of a mask onto a wafer, the mask and the wafer move relative to one another. A fading aberration should be understood to mean an indication of how an image aberration changes in the scanning direction, i.e. in the direction of the relative movement between mask and wafer during the exposure. A focal position aberration is a deviation of the focus of the mask structures to be imaged from the setpoint focal position thereof. The focus that is crucial here is often also designated as "best focus".

The disclosure includes a method according to the disclosure for controlling a microlithographic projection exposure apparatus including a projection lens for imaging mask structures. The projection lens once again includes at least one optical element and at least one manipulator. The method according to the disclosure includes the following steps: reading in application-specific structure information which defines at least one property of an angular distribution of the exposure radiation upon entering the projection lens, and establishing a travel command which defines a change to be made in an optical effect of the at least one optical element by manipulation of a property of the optical element via the at least one manipulator along a travel, in an at least two-stage optimization. In a first stage of the optimization, an approximation of the travel command is established from a state characterization of the projection lens via a first optimization algorithm, which is based on a predefined standard angular distribution of the exposure radiation upon entering the projection lens. In a second stage of the optimization, via a second optimization algorithm, an optimization result of the travel command is established from the approximation of the travel command taking into account the application-specific structure information.

In accordance with one embodiment of the method according to the disclosure, the two-stage optimization is repeated at time intervals of at least one week, in particular at time intervals of at least one month, in the context of a standard setup.

In accordance with a further embodiment, before a repetition of the two-stage optimization, the second stage of the optimization is carried out separately at least once. Carrying out the second optimization stage separately should be understood to mean carrying out the second stage without again carrying out the first optimization stage. Carrying out the second optimization stage separately can be effected for example in the context of the "fast setup" mentioned above.

The features indicated with regard to the abovementioned embodiments, exemplary embodiments or embodiment variants, etc., of the projection exposure apparatus according to the disclosure can be correspondingly applied to the control method according to the disclosure, and vice versa. These and other features of the embodiments according to the disclosure are explained in the description of the figures and the claims. The individual features can be realized either separately or in combination as embodiments of the disclosure. Furthermore, they can describe advantageous embodiments which are independently protectable and protection for which is claimed if appropriate only during or after pendency of the application.

BRIEF DESCRIPTION OF THE DRAWINGS

The above and further advantageous features of the disclosure are illustrated in the following detailed description of exemplary embodiments according to the disclosure with reference to the accompanying schematic drawings, in which.

DETAILED DESCRIPTION OF EXEMPLARY EMBODIMENTS

In the exemplary embodiments or embodiments or embodiment variants described below, elements which are functionally or structurally similar to one another are provided with the same or similar reference signs as far as possible. Therefore, for understanding the features of the individual elements of a specific exemplary embodiment, reference should be made to the description of other exemplary embodiments or the general description of the disclosure.

Figure 1:
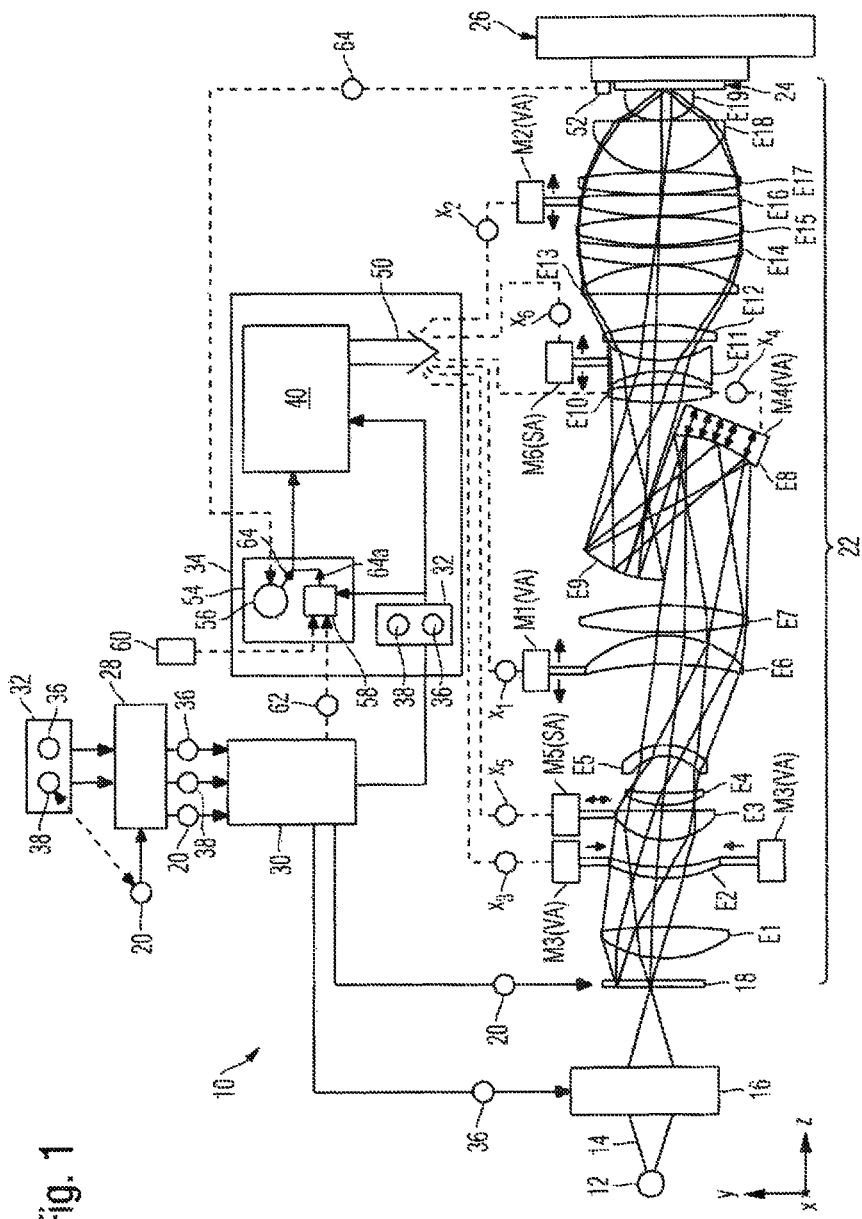
FIG. 1 illustrates an embodiment of a microlithographic projection exposure apparatus including a travel establishing device for generating a travel command.

In order to facilitate the description, a Cartesian xyz-coordinate system is indicated in the drawing, from which system the respective positional relationship of the components illustrated in the figures is evident. In FIG. 1, the x-direction runs perpendicular and into the plane of the drawing, the z-direction toward the right, and the y-direction upwardly.

FIG. 1 shows an embodiment according to the disclosure of a microlithographic projection exposure apparatus 10. The present embodiment is designed for operation in the UV wavelength range, i.e. with electromagnetic radiation of, for example, 365 nm, 248 nm or 193 nm. However, the disclosure is not limited to projection exposure apparatus in the UV wavelength range. Further embodiments according to the disclosure are designed for example for operating wavelengths in the EUV wavelength range, i.e. with electromagnetic radiation having a wavelength of less than 100 nm, in particular a wavelength of approximately 13.5 nm or approximately 6.7 nm. In the case of an operating wavelength in the EUV range, all the optical elements are embodied as mirrors.

The projection exposure apparatus 10 in accordance with FIG. 1 includes an exposure radiation source 12 for generating exposure radiation 14. The exposure radiation 14 firstly passes through an illumination system 16 and is directed by the latter onto a mask 18. The illumination system 16 is configured to generate different angular distributions of the exposure radiation 14 incident on the mask 18. Depending on an illumination mode desired by the user, also called illumination setting, the illumination system 16 configures the angular distribution of the exposure radiation 14 incident on the mask 18. Examples of illumination mode settings that can be chosen include a so-called dipole illumination, annular illumination and quadrupole illumination.

The mask 18 has mask structures for imaging onto a substrate 24 in the form of a wafer and is mounted displaceably on a mask displacing stage. The mask 18 is configured as a transmission mask in the present case. Particularly in the case of EUV lithography, the mask can also be embodied as a reflection mask. In the embodiments in accordance with FIG. 1, the exposure radiation 14 passes through the mask 18 and thereupon passes through a projection lens 22 configured to image the mask structures onto the substrate 24. The exposure radiation 14 is guided within the projection lens 22 via a multiplicity of optical elements E1 to E18. The substrate 24 is mounted displaceably on a substrate displacing stage 26. The projection exposure apparatus 10 can be embodied as a so-called scanner or as a so-called stepper.

The projection lens 22 has 18 optical elements E1 to E18 in the embodiment in accordance with FIG. 1. The optical elements E1 to E7 and E10 to E18 are configured as transmission lens elements, and the optical elements E8 and E9 are configured as mirrors. A respective manipulator M1 to M6 is assigned to the optical elements E2, E3, E6, E8, E11 and E16. While the manipulators M1 to M4 are so-called fully active manipulators (FA), the drivability of which is not subject to any restrictions, the manipulators M5 and M6 are so-called semi-active or partly active manipulators (SA). As already mentioned above, semi-active manipulators can implement only a very limited number of drivings over their lifetime. These manipulators have only a limited influence on the possible lens performance and primarily serve for extending the range of the manipulator system of the projection lens 22 over the lifetime of the lens.

The manipulator M1 assigned to the optical element E6, the manipulator M2 assigned to the optical element E16 and the manipulator M6 allocated to the optical element E11 enable in each case a displacement of the assigned optical elements E6, E16 and E11, respectively, in the z-direction and thus substantially perpendicular to the plane in which the respective optical surfaces of the optical elements lie. The manipulators M1, M2 and M6 are thus respectively allocated a manipulator degree of freedom, the travel setting of which is designated by $x_1$, $x_2$ and $x_6$, respectively.

The manipulator M3 is configured to apply inwardly directed pressure to the edge of the assigned optical element at at least two opposite points, such that the curvature of the optical element E2 is intensified. In other words, the manipulator M3 enables bending of the optical element E2 by compression at the edge side. While the compression direction can be oriented differently in principle, hereinafter for the sake of simplicity the manipulator M3 is allocated only one manipulator degree of freedom (compression in the y-direction in accordance with FIG. 1), the travel setting of which is designated by $x_3$. The manipulator M3 serves for correcting so-called "overlay aberrations" of the projection lens 22. The manipulator degree of freedom defined by the travel setting $x_3$ is therefore designated as overlay degree of freedom. As already mentioned above, overlay aberrations indicate local image position displacements of mask structures imaged onto the substrate 24 relative to the setpoint position thereof on the substrate 24.

The manipulator M4 assigned to the optical element E8 embodied as a mirror serves for the active deformation of the mirror surface of E8 by the targeted actuation of one or more points of the mirror surface in a direction arranged transversely with respect to the mirror surface. A mirror provided with such a manipulator is also known as a deformable mirror. While the degrees of freedom of movement of the different actuation points of the mirror surface can be regarded as separate degrees of freedom of the manipulator M4, for the sake of simplicity manipulator M4 is allocated only one manipulator degree of freedom, the travel setting of which is designated by $x_4$. The manipulator M4, too, serves for correcting overlay aberrations of the projection lens 22. Therefore, the manipulator degree of freedom defined by the travel setting $x_4$ is also designated as overlay degree of freedom.

The manipulator M5 enables a displacement of the optical element E3 assigned to it in the x- and y-directions and thus substantially parallel to the plane in which the optical surface of the optical element E3 lies. That is to say that the manipulator M5 has two degrees of freedom, namely a displacement in the x-direction and a displacement in the y-direction. For the sake of simplicity, hereinafter the manipulator M5 is allocated only one manipulator degree of freedom, designated by the travel setting $x_5$.

Alternatively or additionally, it is also possible to provide manipulators configured to perform some other type of alteration of a state variable of the assigned optical element by corresponding actuation of the manipulator. In this regard, an actuation can for example also be effected by a specific temperature distribution being applied to the optical element. In this case, the travel can be manipulated by an alteration of the temperature distribution.

The projection exposure apparatus 10 furthermore includes a central control unit 30 for controlling the exposure process, including the mask displacing stage and the substrate displacing stage 26. Via a read-in device 28, in the form either of a manual input device or of a data transmission interface, a mask selection indication 20 and application-specific structure information 32 including an illumination mode indication 36 and a mask structure indication 38 assigned to the mask selection indication 20 are read in.

The illumination mode indication 36 defines the illumination mode to be used in the next forthcoming exposure. As mentioned above, the illumination mode, often also called "illumination setting", defines the angular distribution of the exposure radiation 14 incident on the mask structures during the imaging operation of the projection exposure apparatus. The central control unit 30 communicates the illumination mode indication 36 to the illumination system 16 for setting the corresponding illumination mode.

The mask selection indication 20 designates the mask 18 to be used in the next forthcoming exposure. The central control unit 30 communicates the mask selection indication 20 to a mask loading unit for instigating the arrangement of the corresponding mask 18 in the mask plane. As already mentioned above, the mask structure indication 38 designates a structure type of the mask structures on the mask 18 selected via the mask selection indication 20. On the basis of the structure type, the mask structures to be imaged are classified with regard to their effect on the angular distribution of the exposure radiation 14 after interaction with the mask structures, i.e. the angular distribution of the exposure radiation upon entering the projection lens 22. This classification can distinguish e.g. between dense structures, such as e.g. grating structures, and sparsely arranged structures, such as, e.g. isolated lines, or between line structures and hole structures.

Both the illumination mode indication 36 and the mask structure indication 38 thus influence the angular distribution of the exposure radiation 14 upon entering the projection lens 22 and therefore define in each case at least one property of the angular distribution. From the knowledge of both indications 36 and 38, the angular distribution upon entering the projection lens 22 can be calculated at least approximately. The application-specific structure information 32 containing the two indications 36 and 38, which information also designates a so-called "UseCase" in this application, is communicated to the travel establishing device 40 by the central control unit 30.

The projection exposure apparatus 10 furthermore includes a manipulator controller 34 for controlling the manipulators M1 to M6. The manipulation controller 34 in turn includes a state generator 54 and the travel establishing device 40. The state generator 54 transfers current state characterizations 64 and 64a of the projection lens 22 to the travel establishing device 40, which generates a travel command 50 therefrom. The travel command 50 includes travels $x_i$, in the case shown the travels $x_1$ to $x_6$. The travels $x_1$ to $x_6$ serve for controlling the manipulators M1 to M6 along the manipulator degrees of freedom assigned thereto, as described in greater detail below.

As already mentioned, the travel command 50 generated by the travel establishing device 40 includes changes to be made by the manipulators M1 to M6 in the form of travels $x_i$ of corresponding state variables of the associated optical elements. In this case, a distinction is drawn between an operating adjustment and a maintenance adjustment. In the operating adjustment only the settings of the fully active manipulators M1 to M4 are optimized, while in the maintenance adjustment the settings of all manipulators, i.e. both of the fully active manipulators M1 to M4 and of the semi-active manipulators M5 and M6, are optimized. The established travels $x_i$ are communicated to the individual manipulators M1 to M6 via travel signals and predefine for them respective correction travels to be formed. In the operating adjustment, the travels $x_5$ and $x_6$ are not included by the travel command 50, or have the value zero. The correction travels define corresponding displacements of the assigned optical elements for correcting wavefront aberrations of the projection lens 22 that have occurred or are expected.

In order to establish the travels $x_i$, the travel establishing device 40 receives from the state generator 54 respectively updated state characterizations in the form of aberration parameters of the projection lens 22. The respectively updated state characterizations are generally extrapolated state characterizations 64a in the case of the operating adjustment and measured state characterizations 64 in the case of the maintenance adjustment.

In the operating adjustment, the travel establishing device 40 in accordance with one embodiment generates updated travels $x_i$ in periods of time of less than one second. By way of example, the travels $x_i$ can be updated in periods of time of less than 200 milliseconds and thus in real time. An updating of the travels that is carried out in less than one second makes it possible, for example, to readjust the manipulators after each field exposure.

The aberration parameters included by the state characterization 64 or 64a can include for example Zernike coefficients characterizing the wavefront. In the present application, as described for example in paragraphs [0125] to [0129] of US 2013/0188246A1, the Zernike functions known from e.g. Chapter 13.2.3 of the textbook "Optical Shop Testing", $2^{nd}$ Edition (1992) by Daniel Malacara, publisher John Wiley & Sons, Inc. $Z_m^n$ are designated by $Z_j$ in accordance with so-called fringe sorting, in which case $c_j$ are then the Zernike coefficients assigned to the respective Zernike polynomials (also referred to as "Zernike Functions"). Fringe sorting is illustrated for example in Table 20-2 on page 215 of "Handbook of Optical Systems", Vol. 2 by H. Gross, 2005 Wiley-VCH Verlag GmbH & Co. KGaA, Weinheim. A wavefront deviation $W(\rho,\Phi)$ at a point in the image plane of the projection lens is expanded depending on the polar coordinates ($\rho$, $\Phi$) in the pupil plane as follows:

$$W(\rho, \Phi) = \sum_j c_j \cdot Z_j(\rho, \Phi) \qquad (1)$$

While the Zernike polynomials are designated by $Z_j$, i.e. with a subscripted index j, in the context of this application the Zernike coefficients $c_j$, as customary among those skilled in the art, are designated by Zj, i.e. with a normally positioned index, such as Z5 and Z6 for astigmatism, for example.

In accordance with one embodiment, the state generator 54 has a memory 56 and a simulation unit 58. State characterizations 64 in the form of aberration parameters that were established via a wavefront measurement at the projection lens 22 are stored in the memory 56. These measurement results can be collected via an external wavefront measuring device. Alternatively, however, the state characterizations 64 can also be measured by a wavefront measuring unit 52 integrated in the substrate displacing stage 26. For instance, such a measurement can be carried out regularly after each exposure of a wafer or respectively after the exposure of a complete wafer set. Alternatively, a simulation or a combination of simulation and reduced measurement can also be performed instead of a measurement.

For the purpose of the maintenance adjustment, the state characterization is forwarded directly to the travel establishing device 40. In the context of the operating adjustment, by contrast, the measured values of the state characterization 64 in the form of aberration parameters, the measured values being stored in the mirror 56, are adapted by the simulation unit 58 to respective updated conditions during the exposure process. In accordance with one embodiment variant, for this purpose the current irradiation intensity 62 is regularly communicated to the simulation unit 58 by the central control unit 30.

The simulation unit 58 calculates therefrom changes in the aberration parameters brought about on account of lens element heating on the basis of the respective illumination mode indication 36 and/or the respective mask structure indication 38. Furthermore, the simulation unit continuously receives measured values from a pressure sensor 60 that monitors the ambient pressure of the projection exposure apparatus 10. Effects of changes in the ambient pressure on the aberration parameters are taken into account by the simulation unit 58.

Figure 2:
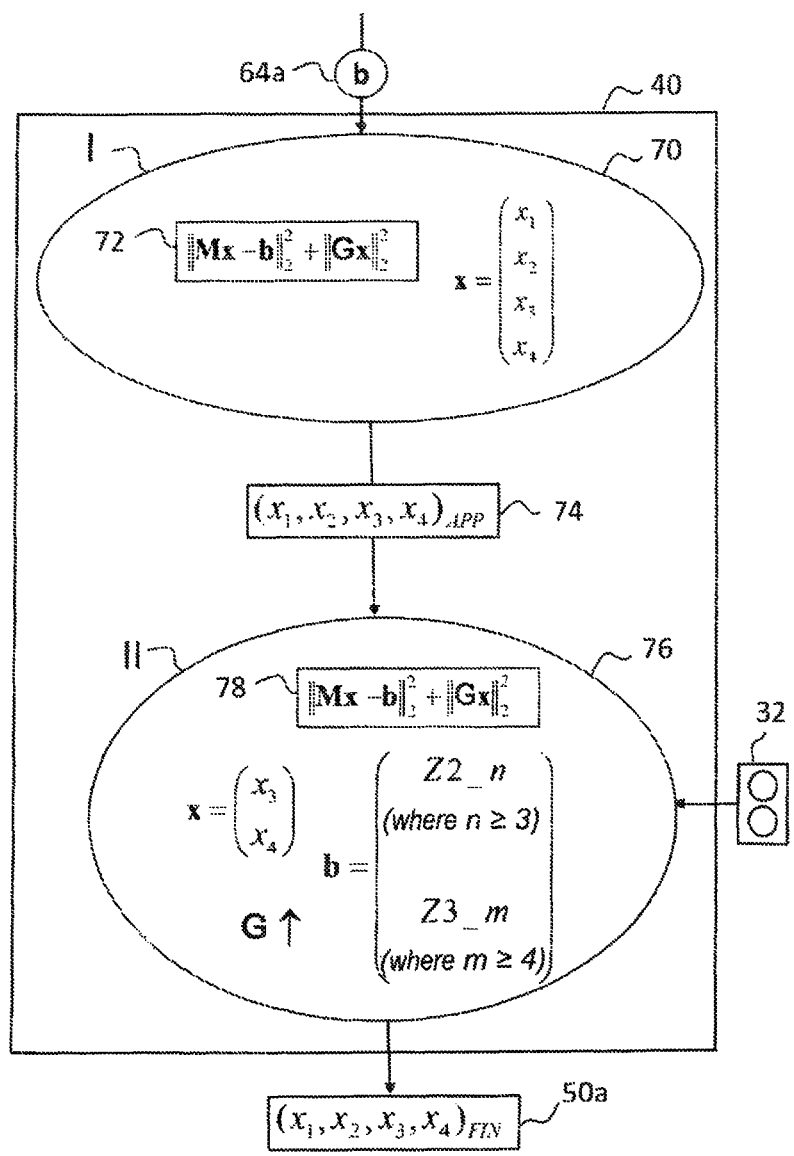
FIG. 2 illustrates the functioning of the travel establishing device in accordance with FIG. 1 in the context of an operating adjustment.
Figure 3:
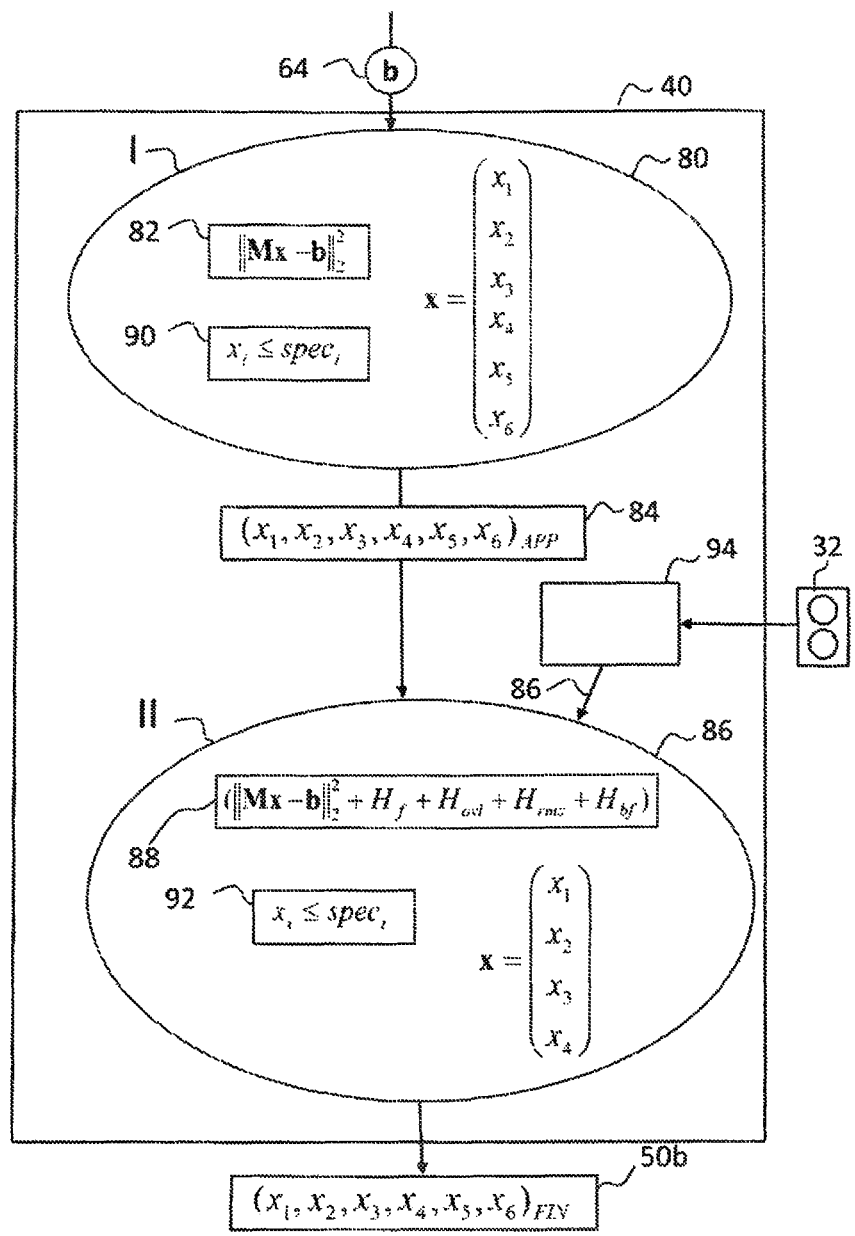
FIG. 3 illustrates the functioning of the travel establishing device in accordance with FIG. 1 in the context of a maintenance adjustment.

The functioning of the travel establishing device 40 is illustrated in FIG. 2 for the case of the operating adjustment and in FIG. 3 for the case of the maintenance adjustment. Referring to FIG. 2, firstly the functioning of the optimization performed at short time intervals in the context of the operating adjustment is explained below. The optimization is effected in each case in two stages. In the first optimization stage, identified by "I" in FIG. 2, an approximated travel command 74 is established via a first optimization algorithm 70 from the state characterization provided by the state generator 54, specifically directly after a wavefront measurement firstly from the measured state characterization 64 and thereupon respectively from the extrapolated state characterization 64a.

The first optimization algorithm 70 serves for optimizing a merit function 72, also called objective function. In accordance with one embodiment, the optimization problem solved here reads as follows:

$$\min(\|Mx-b\|_2^2 + \|Gx\|_2^2) \qquad (2)$$

The merit function $\|Mx-b\|_2^2 + \|Gx\|_2^2$ that is minimized in this case is a Tikhonov-regularized merit function and contains $\|Mx-b\|_2^2$ as main term and $\|Gx\|_2^2$ as so-called penalty term. In this case, $\|\ \|_2$ denotes the Euclidean norm. As already mentioned, optimization algorithms based on Tikhonov regularization are time-optimized, that is to say that they yield fast optimization results in comparison with conventional optimization algorithms. The travels of the approximated travel command 74 to be generated by the optimization algorithm 70 are described by a travel vector x, the vector components of which in the present embodiment are the travel settings $x_1$ to $x_4$ assigned to the fully active manipulators M1 to M4 in accordance with FIG. 1. The current state characterization 64 or 64a is described by a state vector b. The sensitivities of the manipulators NI, in the present case the manipulators M1 to M4, with regard to the degrees of freedom thereof in the case of a state change are described via a sensitivity matrix M in accordance with one embodiment variant. In this case, the sensitivity matrix M describes the relationship between an adjustment of the manipulator $M_i$ by a standard travel $x_i^0$ and a resultant change in the state vector b of the projection lens 22.

The weight matrix G contained in the penalty term contains weighting parameters for each of the travel settings $x_i$, the weighting parameters serving to counteract a deviation of the travel setting $x_i$ of the relevant travel from a basic setting during the execution of the optimization algorithm 70. To put it generally, this counteracting is brought about by the weight matrix G by virtue of the fact that in the case of an increasing deviation of the travel setting $x_i$ of a travel from the basic setting thereof, the value of the penalty term progressively increases. Without further measures, the use of such a weight matrix G leads to "soft limit values" for the relevant travel settings $x_i$. Specifically, the weight matrix G acts like rubber bands on the travel settings to be adopted by the manipulators $M_i$, which prevent an excessive deviation from the initial or basic settings thereof, but do not predefine rigid limits for the deviation. With regard to the fundamental configuration of such a weight matrix G, reference is made to the indications given in the document WO 2010/034674 A1, in particular pages 42 and 43 of the document, in connection with the description of a Tikhonov regularization.

The weight matrix G is set to a predefined standard angular distribution of the exposure radiation 14 when entering the projection lens 22, that is to say that the angular distribution on which the weight matrix G is based is effected independently of the current application-specific structure information 32 and preferably remains unchanged from optimization to optimization. Subsequent optimization of the weighting parameters contained in the weight matrix G, also referred to as weighting parameters of the Tikhonov regularization in the context of this application, on the basis of the current application-specific structure information 32 is therefore not necessary. The first optimization stage can thus proceed fully automatically at high speed. As a result the first optimization stage yields the approximated travel command 74 including approximations of the travel settings $x_1$ to $x_4$.

In the second optimization stage, designated by "II" in FIG. 2, the final travel command 50a is established via a second optimization algorithm 76, proceeding from the approximated travel command 74, the final travel command then being used as travel command 50 for driving the manipulators M1 to M4 according to FIG. 1 in the context of the operating adjustment. The second optimization algorithm 76 serves for minimizing a merit function 78 which, in the present embodiment, does not differ from the merit function 72 in terms of the fundamental construction, that is to say that it is likewise a Tikhonov-regularized merit function in the present exemplary embodiment. The merit function 78 differs in the choice of the weighting parameters contained in the weight matrix G, however in so far as the weighting parameters in the merit function 78 are chosen more robustly in relation to the merit function 72, that is to say that they have comparatively high values which allow only smaller deflections of the assigned manipulator degrees of freedom.

The second optimization algorithm 76 is designed in a targeted manner to adapt the approximated travel command 74 established in the first optimization stage to the currently present angular distribution—defined by the application-specific structure information 32—of the exposure radiation 14 when entering the projection lens 22. In other words, the second optimization stage is configured in a targeted manner for taking account of the application-specific structure information 32. In the present embodiment of the merit function 78, this is effected by targeted selection of the weighting parameters in the weight matrix G, of the travel vector x and of the state vector b.

In this way, a recognition that a changed angular distribution in the exposure radiation 14 principally influences overlay aberrations is used to the effect that the travel vector x used in the second optimization stage is allocated only the travel settings $x_3$ and $x_4$ assigned to the manipulators M3 and M4. Thus, only the overlay degrees of freedom of the manipulator system are optimized in the second optimization stage. In a manner adapted thereto, the state vector b used in the second optimization stage includes in a targeted manner Zernike coefficients characterizing overlay aberrations of the projection lens 22, such as, for instance, the Zernike coefficients Z2, Z3, Z7 and Z8. In the present embodiment, the state vector b includes the field-resolved overlay aberration parameter Z2_3 (field profile of third order of the Zernike coefficient Z2) and field profiles of higher orders of the Zernike coefficient Z2 and furthermore the field-resolved overlay aberration parameter Z3_4 (field profile of fourth order of the Zernike coefficient Z3) and field profiles of higher orders of the Zernike coefficient Z3. In this context, the order of the field profile is understood to mean the radial order of the field profile.

On account of the robustly chosen weighting parameters of the weight matrix G, subsequent optimization of the weighting parameters is not necessary and the second optimization stage can likewise proceed fully automatically at high speed. As optimization algorithm 76 of the second optimization stage, instead of the above-described optimization algorithm in a Tikhonov regularization, it is also possible to use a different optimization algorithm, for instance a so-called "fundamental" optimization algorithm having external constraints.

Referring to FIG. 3, the functioning of the optimization performed in the context of the maintenance adjustment is explained below. The complete maintenance adjustment, also referred to as standard setup, is usually performed at intervals of more than one week, e.g. once a month. All the manipulators of the projection lens 22, that is to say not only the fully active manipulators M1 to M4 but also the semi-active manipulators M5 and M6 serving for extending the range of the manipulator system, are included in the maintenance adjustment. The optimization according to the disclosure in the context of the maintenance adjustment, as illustrated in FIG. 3, is likewise effected in two stages.

In the first optimization stage, identified by "I", an approximated travel command 84 is established via a first optimization algorithm 80 from the measured state characterization 64 provided by the state generator 54. This is effected, for example, by the optimization of a merit function 82 taking account of external constraints 90. In accordance with one embodiment, the optimization problem solved here reads as follows:

$$\min\|Mx-b\|_2^2$$

where $$x_i \leq \text{spec}_i \quad (3)$$

In this case, spec' denotes the constraints allocated to the respective travel settings $x_i$. The travel vector x used here includes as vector components the travel settings of all manipulator degrees of freedom of the projection lens 22, that is to say the travel settings $x_1$ to $x_6$ in the present case. The first optimization algorithm 80 of the maintenance adjustment, like the first optimization algorithm 70 of the operating adjustment as well, is designed for a predefined standard angular distribution of the exposure radiation 14 when entering the projection lens 22, that is to say that the current application-specific structure information 32 is disregarded in the first optimization stage.

The first optimization algorithm 80 is designed for optimum accuracy and is therefore very time-consuming in its execution. In this regard, performing the first optimization stage may take a number of hours. As a result the first optimization stage yields the approximated travel command 84 including approximations of the travel settings $x_1$ to $x_6$, in the present case.

The travel establishing device 40 includes an algorithm generator 94, which is configured to generate a second optimization algorithm 86 on the basis of the application-specific structure information 32 defining the currently present angular distribution of the exposure radiation 14 when entering the projection lens 22, the second optimization algorithm serving to generate the final travel command from the approximated travel command 84.

In the second optimization stage, designated by "II" in FIG. 3, the final travel command 50b is established via the second optimization algorithm 86, proceeding from the approximated travel command 84, the final travel command then being used as travel command 50 for driving the manipulators M1 to M4 according to FIG. 1 in the context of the maintenance adjustment. The second optimization algorithm 86 serves for minimizing a merit function 88, in particular taking account of external constraints 92. The number of external constraints 92 can be greater than 100, in particular greater than 1000 or greater than 10 000. Furthermore, the merit function 88 in accordance with one embodiment also includes implicit constraints. In accordance with one embodiment variant, the merit function 88 reads as follows:

$$\|Mx-b\|_2^2 + H_f + H_{ovl} + H_{rms} + H_{bf} \qquad (4)$$

In this case, $H_f$ denotes a term of the merit function 88 which contains a constraint with regard to so-called fading-aberrations. A fading-aberration should be understood to mean an indication of how an image aberration changes in the scanning direction of a projection exposure apparatus, i.e. in the direction of the relative movement between mask and wafer, during the exposure. $H_{ovl}$ describes a constraint with regard to overlay aberration or of summation values of overlay aberrations of the projection lens 22. $H_{rms}$ contains grouped RMS values of the Zernike coefficients $b_j$ as constraint. As is known to the person skilled in the art, an RMS value of coefficients should be understood to mean the root of the sum of the squares of the coefficients. Furthermore, grouped RMS values and weighted sums of selected Zernike coefficients can be incorporated in the merit function 88. $H_{bf}$ describes a constraint which predefines specifications with regard to summation values of so-called focal position aberrations, also referred to as "best focus" sums. As already mentioned above, a focal position aberration is a deviation of the focus of the mask structures to be imaged from the setpoint focal position thereof. The focus that is crucial here is often also designated as "best focus".

Analogously to the second optimization algorithm 76 of the operating adjustment, the second optimization algorithm 86 of the maintenance adjustment is designed in a targeted manner to adapt the approximated travel command 74 established in the first optimization stage to the currently present angular distribution—defined by the application-specific structure information 32—of the exposure radiation 14 when entering the projection lens 22. In other words, the second optimization stage is configured in a targeted manner for taking account of the application-specific structure information 32. Furthermore, in the context of the maintenance adjustment, the second optimization stage is intended to proceed considerably faster, in particular faster by at least the factor 5 or 10, in comparison with the first optimization stage. In this regard, the period of time for carrying out the second optimization stage can be, for example, less than 1 hour, less than 10 minutes, less than 1 minute or less than 1 second.

In order to achieve these stipulations, the travel vector x used in the second optimization stage is restricted to the degrees of freedom of the fully active manipulators, that is to say in the present case to the degrees of freedom assigned to the travel settings $x_1$ to $x_4$.

On account of the desired short time of the second optimization stage, for the case where the "UseCase" changes during the production operation of the projection exposure apparatus 10, the second optimization stage can be repeated on the basis of the changed application-specific structure information 32, but still proceeding from the approximated travel command 84 established beforehand, and the new final travel vector 50b established in this case can be taken as a basis for further production operation. The repeated performance of the second optimization stage can be designated as "fast setup", in the case of which the result of the "standard setup" is then adapted to a new "UseCase".

The above description of exemplary embodiments should be understood to be by way of example. The disclosure effected thereby firstly enables the person skilled in the art to understand the present disclosure and the advantages associated therewith, and secondly encompasses alterations and modifications of the described structures and methods that are also obvious in the understanding of the person skilled in the art. Therefore, all such alterations and modifications, in so far as they fall within the scope of the disclosure in accordance with the definition in the accompanying claims, and equivalents are intended to be covered by the protection of the claims.

LIST OF REFERENCE SIGNS

10 Projection exposure apparatus
12 Exposure radiation source
14 Exposure radiation
16 Illumination system
18 Mask
20 Mask selection indication
22 Projection lens
24 Substrate
26 Substrate displacing stage
28 Read-in device
30 Central control unit
32 Application-specific structure information
34 Manipulator controller
36 Illumination mode indication
38 Mask structure indication
40 Travel establishing device
50 Travel command
50a Final travel command
50b Final travel command
52 Wavefront measuring unit
54 State generator
56 Memory
58 Simulation unit
60 Pressure sensor
62 Current irradiation intensity
64 Measured state characterization
64a Extrapolated state characterization
70 First optimization algorithm
72 Merit function
74 Approximated travel command 76 Second optimization algorithm
78 Merit function
80 First optimization algorithm
82 Merit function
82 Approximated travel command
84 Second optimization algorithm
86 Merit function
88 Constraints
92 Constraints
94 Algorithm generator
E1-E18 Optical elements
M1-M6 Manipulators
b State vector
x Travel vector
G Weight matrix
$x_1$-$x_6$ Travel settings

What is claimed is:

1. An apparatus, comprising:
   a projection lens configured to image mask structures via exposure radiation, the projection lens comprising an optical element and a manipulator;
   a read-in device configured to read in application-specific structure information defining a property of an angular distribution of the exposure radiation upon entering the projection lens; and
   a travel establishing device configured to establish a travel command defining a change to be made in an optical effect of the optical element via manipulation of a property of the optical element via the manipulator along a travel,
   wherein:
      the travel establishing device is configured to establish the travel command in an at least two-stage optimization;
      a first stage of the optimization is configured to establish an approximation of the travel command from a state characterization of the projection lens via a first optimization algorithm based on a predefined standard angular distribution of the exposure radiation upon entering the projection lens;
      a second stage of the optimization is configured to establish an optimization result of the travel command via a second optimization algorithm from the approximation of the travel command taking into account the application-specific structure information; and
      the apparatus is a microlithographic projection exposure apparatus.

2. The apparatus of claim 1, wherein the application-specific structure information comprises: a) an indication regarding the illumination mode used during the imaging of the mask structures; and/or b) an indication regarding a structure type of the mask structures.

3. The apparatus of claim 2, wherein:
   the travel command comprises travel settings assigned to a multiplicity of manipulator degrees of freedom of the manipulator;
   travel settings assigned to a first set of the manipulator degrees of freedom serve as optimization variables in the first stage of the optimization; and
   travel settings assigned to a second set of the manipulator degrees of freedom serve as optimization variables in the second stage of the optimization.

4. The apparatus of claim 3, wherein the first set of the manipulator degrees of freedom is mutually exclusive of the second set of the manipulator degrees of freedom.

5. The apparatus of claim 4, wherein the second set of the manipulator degrees of freedom contains fewer manipulator degrees of freedom than the first set of the manipulator degrees of freedom.

6. The apparatus of claim 5, wherein the second set of the manipulator degrees of freedom comprises overlay degrees of freedom of the projection lens such that manipulation via the manipulator along one of the overlay degrees of freedom or along a combination of a plurality of the overlay degrees of freedom brings about a change in an overlay aberration of the projection lens.

7. The apparatus of claim 6, wherein the state characterization of the projection lens comprises aberration parameters characterizing an imaging quality of the projection lens, and the second stage of the optimization is effected on the basis of a subset of the aberration parameters whose elements in each case relate to an overlay aberration of the projection lens.

8. The apparatus of claim 7, wherein the first optimization algorithm is based on a merit function in a Tikhonov regularization which contains implicit constraints described with the aid of weighting parameters, and the values of the weighting parameters are left unchanged when the first optimization algorithm is executed.

9. The apparatus of claim 8, wherein the travel establishing device is configured to establish the travel command in less than one second.

10. The apparatus of claim 9, wherein the travel establishing device is configured to carry out the two-stage optimization in the context of a maintenance adjustment and to perform the second stage of the optimization, in each case proceeding from the approximation of the travel command, for different items of application-specific structure information.

11. The apparatus of claim 1, wherein the state characterization of the projection lens comprises aberration parameters characterizing an imaging quality of the projection lens, and the second stage of the optimization is effected on the basis of a subset of the aberration parameters whose elements in each case relate to an overlay aberration of the projection lens.

12. The apparatus of claim 1, wherein:
   the travel command comprises travel settings assigned to a multiplicity of manipulator degrees of freedom of the manipulator;
   travel settings assigned to a first set of the manipulator degrees of freedom serve as optimization variables in the first stage of the optimization; and
   travel settings assigned to a second set of the manipulator degrees of freedom serve as optimization variables in the second stage of the optimization.

13. A method of controlling a microlithographic projection exposure apparatus comprising a projection lens for imaging mask structures, the projection lens comprising an optical element and a manipulator, the method comprising:
   reading in application-specific structure information defining a property of an angular distribution of the exposure radiation upon entering the projection lens; and
   establishing a travel command defining a change to be made in an optical effect of the optical element by manipulation of a property of the optical element via the manipulator along a travel in an optimization comprising first and second stages,
   wherein:
      in the first stage of the optimization, an approximation of the travel command is established from a state characterization of the projection lens via a first optimization algorithm based on a predefined standard angular distribution of the exposure radiation upon entering the projection lens; and in the second stage of the optimization, via a second optimization algorithm an optimization result of the travel command is established from the approximation of the travel command taking into account the application-specific structure information.

14. the method of claim 13, wherein the optimization is repeated at time intervals of at least one week in the context of a standard set-up.

15. The method of claim 14, wherein, before a repetition of the optimization, the second stage of the optimization is carried out separately at least once.

* * * * *

UNITED STATES PATENT AND TRADEMARK OFFICE
CERTIFICATE OF CORRECTION

| | | |
|---|---|---|
| PATENT NO. | : 9,910,364 B2 | Page 1 of 1 |
| APPLICATION NO. | : 15/298323 | |
| DATED | : March 6, 2018 | |
| INVENTOR(S) | : Boris Bittner et al. | |

It is certified that error appears in the above-identified patent and that said Letters Patent is hereby corrected as shown below:

In the Specification

Column 2, Line 45: Delete "decentrization" and insert -- decentralization --, therefor.

Column 10, Line 57: Delete "Ell" and insert -- E11 --, therefor.

Column 11, Line 3: Delete "Ell" and insert -- E11 --, therefor.

Column 11, Line 5: Delete "Ell" and insert -- E11 --, therefor.

Column 19, Line 5: Delete "82" and insert -- 84 --, therefor.

Column 19, Line 6: Delete "84" and insert -- 86 --, therefor.

Column 19, Line 7: Delete "86" and insert -- 88 --, therefor.

Column 19, Line 8: Delete "88" and insert -- 90 --, therefor.

In the Claims

Column 21, Line 10: In Claim 14, delete "the" and insert -- The --, therefor.

Signed and Sealed this
Twenty-second Day of May, 2018

Andrei Iancu
*Director of the United States Patent and Trademark Office*